United States Patent [19]

Douglas et al.

[11] Patent Number: 4,476,217
[45] Date of Patent: Oct. 9, 1984

[54] SENSITIVE POSITIVE ELECTRON BEAM RESISTS

[75] Inventors: Richard B. Douglas, Crystal; Barbara J. Fure, Edina; Juey H. Lai, Burnsville, all of Minn.

[73] Assignee: Honeywell Inc., Minneapolis, Minn.

[21] Appl. No.: 578,987

[22] Filed: Feb. 13, 1984

Related U.S. Application Data

[63] Continuation-in-part of Ser. No. 376,343, May 10, 1982, abandoned.

[51] Int. Cl.³ .................. B05D 3/02; G03C 5/16; G03C 5/24
[52] U.S. Cl. ........................ 430/326; 430/296; 430/327; 430/330; 430/270
[58] Field of Search ............ 430/296, 326, 327, 330, 430/270, 910, 935; 427/43.1

[56] References Cited

U.S. PATENT DOCUMENTS

| | | | |
|---|---|---|---|
| 3,914,462 | 10/1975 | Morishita et al. | 427/43 |
| 3,984,582 | 10/1976 | Feder et al. | 427/43 |
| 4,011,351 | 3/1977 | Gipstein et al. | 427/43 |
| 4,087,569 | 5/1978 | Hatzakis | 430/296 X |

Primary Examiner—John E. Kittle
Assistant Examiner—Cynthia Hamilton
Attorney, Agent, or Firm—Charles G. Mersereau

[57] ABSTRACT

Highly sensitive positive electron beam resists comprised of copolymers of methacrylic acid (MAA) and t-butyl methacrylate (TBM) are disclosed in which a thin film of high molecular weight MAA/TBM copolymer is applied to a suitable substrate. Prior to exposure, the copolymer is prebaked at a temperature below the decomposition temperature to improve the sensitivity and resolution of the resist. The exposed resist is developed by spraying with a suitable solvent. The positive electron resists produced in accordance with the present invention exhibit a high sensitivity and good submicron resolution.

5 Claims, 2 Drawing Figures

1 μm

1 μm

SENSITIVE POSITIVE ELECTRON BEAM RESISTS

This application is a continuation-in-part of application Ser. No. 376,343, filed May 10, 1982, abandoned.

The invention herein described was made in the course of or under a contract or subcontract thereunder with the Department of the Army.

BACKGROUND OF THE INVENTION

1. Field of the Invention

The present invention relates generally to the field of radiation sensitive resist films used in microcircuit fabrication and, more particularly, to the fabrication of positive electron beam sensitive resist films comprised of copolymers of methacrylic acid and t-butyl methacrylate having high sensitivity and submicron resolution.

2. Description of the Prior Art

The application of electron beam techniques to semiconductor fabrication has enabled great strides to be made in reducing the minimum line width and thus the size of an integrated circuit pattern which can successfully be manufactured. This has been accomplished both through progress in the technology involved including improvement in the precision of the electron beam system itself and in the progress which has been made in the technology concerned with the pattern defining medium or resist material.

In electron beam microfabrication, a substrate, which may be, for example, silicon dioxide, silicon, glass or chromium plated glass, is coated with a layer of polymer resist material. The resist is patterned by changing the solubility of the polymer with an electron beam. Subsequently, the resist film is "developed" by dissolving away the unwanted area of polymer utilizing a suitable solvent material and the resultant pattern is used as a mask for plating, chemical etching, ion etching or ion implantation. This electron beam lithography (EBL) is an integrated circuit production technique which utilizes a polymer resist to delineate circuit patterns for monolithic circuits.

When polymer resist materials of the required type are irradiated with an electron beam, the molecular structure is affected such that some of the polymer molecules are excited or ionized by the beam. This excitation causes some of the resist molecules to cross-link with other molecules in the polymer and others to degrade or undergo scission. The predominant manner in which such a polymeric material reacts to exposure to an electron beam has led electron resists to be classified into two main categories. A polymer which becomes predominately gelled or cross-linked, and thereby decreases its solubility after irradiation, is termed a negative resist. Conversely, if the scission process predominates and the solubility of the polymer increases after irradiation, it is called a positive resist. The resists of the present invention are positive resists.

A suitable electron resist material must have certain characteristic physical and chemical properties which allow it to fulfill the requirements for electron beam fabrication. The polymer material involved must be sensitive to an electron current of a fairly low value or the resist sensitivity itself will be the limiting factor on the writing speed and line width which can be achieved. The resist medium must be capable of achieving a high resolution or resist contrast compatible with that of writing and etching techniques utilizing the high resolution capability available with electron beam technology. In addition, the resist must have the ability to adhere satisfactorily to a variety of substrates used in different microfabrication applications. The medium also must be able to withstand normal acid, base, plasma and ion etching processes and should not be sensitive to small daily process variabilities.

Positive type electron resist films of comonomers of methylmethacrylate (MMA) with such monomers as acrylonitrile (AN), methacrylonitrile (MCN) and maleic anhydride are known in the prior art. Such combinations are shown in U.S. Pat. No. 3,914,462 to Morifshita et al. Similar copolymer materials are disclosed in a patent to Gipstein et al U.S. Pat. No. 4,011,351, which discloses a method of producing a positive resist image from copolymers of alkyl methacrylate units and polymerized units of certain other ethylenically unsaturated monomers. Those copolymers include alkyl methacrylate units wherein the alkyl group contains from one to four carbon atoms copolymerized with ethylenically unsaturated monomers which may contain any of numerous substituted groups. Certain other polymerized alkyl methacrylate copolymers including polymerized monoethylenically unsaturated acid units have also been proposed in Feder et al, U.S. Pat. No. 3,984,582.

The prior art such as the Feder et al patent, cited above, also discloses the use of a prebaking fabrication step in which the prepared polymeric resist, having been coated upon a substrate by spin coating or dipping and dried to remove volatile material, is prebaked. The prebaking temperature is above the glass transition temperature of the polymeric material, but below the decomposition temperature of the material to remove any remaining solvent. The prebaking step changes the solubility of the copolymer and improves adhesion to the substrate.

A prior application to Lai, J. H.; Douglas, R.; and Shepherd, L., Ser. No. 261,427, filed May 7, 1981, and assigned to the same assignee as the present invention, is directed to a method of making a different positive electron resist comprising a copolymer of methacrylic acid (MAA) and methacrylonitrile (MCN). Lai and Douglas are co-inventors in the present application.

The change in solubility of such copolymer resists has been found to be highly dependent on the prebaking temperature and time and is very hard to control. Thus, the time and temperature must be adapted to the particular polymer and desired result. Also, the temperature and time control in the prebake step must be extremely accurate in order to maintain reproducibility of resist sensitivity and resolution in the development of such resists.

Thus, it can be seen from the prior art that numerous polymers including copolymers of MAA and substituted MAA esters copolymerized with various ethylenically unsaturated monomers have been proposed. In addition, prebaking steps have been utilized in the preparation of resist films utilizing such copolymer combinations such as MMA/MAA with varying degrees of success.

SUMMARY OF THE INVENTION

According to the present invention, it has been discovered that excellent positive electron beam resists having high sensitivity and resolution can be produced using copolymers of methacrylic acid (MAA) and t-butyl methacrylate (TBM) in a range of percentage composition ratios. The positive electron resists produced in accordance with the present invention exhibit a high sensitivity, and very good submicron resolution.

In the preferred fabrication process, a copolymer of methacrylic acid (MAA) and t-butyl methacrylate (TBM) is prepared by free-radical solution polymerization using a free radical initiator in a manner which produces a high molecular weight copolymer wherein the $\overline{M}_w$ (weight average molecular weight) of the polymer may be as high as 800,000. The poly (MAA-co-TBM) produced is dissolved in a suitable solvent such as methyl cellosolve (2-methoxy ethanol) and coated on a suitable substrate such as $SiO_2$ or chromium-coated glass. The coated substrate is then prebaked at an elevated temperature below its decomposition temperature. The actual temperature and the time involved depend on the relative composition of the copolymer and the subsequent resist properties desired. The resist film is then exposed to a predetermined pattern of radiation by an electron beam or other source and developed. Development is preferably done by spraying with a suitable developing solvent such as a mixture of methyl cellosolve (MCV) and methyl isobutyl ketone (MIBK) which removes the exposed area. Solvent selection depends on the particular percentage composition, prebake temperature and other considerations. The resist film may then be post-baked at a temperature suitable for removing the remaining developing solvent.

It should be noted that while the invention is described herein with particular regard to electron beam techniques and as an electron beam resist it is understood that other exposure techniques can be used with the polymers of the present invention. These include lithography techniques which utilize such sources as X-ray, ion beam and deep uv as the activating ionizing radiation energy. The only limitation is that the polymer be properly activated by the source without adverse side effects.

DESCRIPTION OF THE PREFERRED EMBODIMENT

Figure 1:
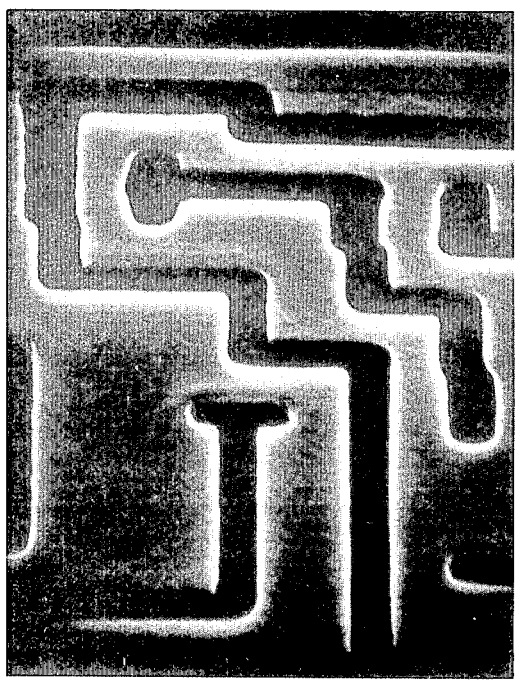
FIGS. 1 and 2 are, respectively, top and transverse cross section views of a Scanning Electron Micrograph (SEM) of developed resist images of one MAA/TBM copolymer resist of the invention.
Figure 2:
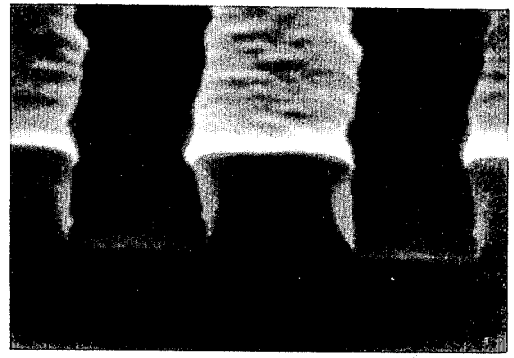

High molecular weight MAA/TBM copolymers of widely differing MAA/TBM ratios have been found to possess excellent positive electron resist behavior. While success in achieving this observed behavior depends to a great extent on properly matching process steps and variables associated with the process steps to the particular polymer composition and molecular weight involved, certain common criteria are important. These include using MAA/TBM copolymers of high weight average molecular weight ($200,000 \leq \overline{M}_w \leq 800,000$) and low molecular weight distribution $\overline{M}_w/\overline{M}_n$ where $\overline{M}_n$ is the number average molecular weight. Prebaking the resist at a proper temperature (at least 180° C.) after coating on the substrate but before electron beam exposure, and using the proper developing solvent and technique. In accordance with the following examples, highly sensitive positive electron resists capable of submicron resolution are produced.

POLYMER PREPARATION

The MAA/TBM copolymers were generally prepared by free-radical polymerization in solution. Because the electron resist sensitivity increases with increasing polymer molecular weight, the polymerization conditions were adjusted so that high molecular weight polymers were obtained. The preferred $\overline{M}_w$ of the polymers is from about 200,000 to 800,000 depending on the MAA:TBM mole percentage composition of the copolymer.

EXAMPLE 1

A solution was prepared by dissolving 15 ml of vacuum-distilled (6 mm Hg) methacrylic acid (MAA) and 15 ml of vacuum distilled t-butyl methacrylate (TBM) in 180 ml of chlorobenzene. The MAA monomer was obtained from Eastman Kodak, Rochester, N.Y., and the TBM monomer was obtained from Polysciences, Inc. of Warrington, Pa. The solution was placed in a 250 ml, 3-neck, round-bottom flask equipped with a stirring mechanism, reflux condenser and nitrogen gas inlet. The mixture of monomer and solvent was then heated to 55° C. in the presence of flowing $N_2$ gas. A free-radical initator consisting of 40 mg of 2,2-azo-bis-isobutyronitrile (AIBN) was then added as a free radical initiator for the polymerization. The polymerization was carried out at 55° C. for 4 hours. Since the MAA/TBM copolymer does not dissolve in chlorobenzene, it continuously precipitates out as soon as it is formed. Thus, the polymerization is, in fact, a "precipitation polymerization". The polymer was then separated from the mixture by filtering to remove unreacted monomers and washing twice with petroleum ether. The copolymer was dried at 45° C. for 24 hours at about $10^{-2}$ Torr. The yield of the polymer was about 19.1 gm. Elemental analysis of the copolymer indicated that it contained 21.8 mole percent of TBM and 78.2 mole percent of MAA. It had a weight average molecular weight, $\overline{M}_w = 632,000$, a number average molecular weight $\overline{M}_n = 338,000$ and, thus, a molecular weight distribution $\overline{M}_w/\overline{M}_n = 1.87$. This polymer appears as Copolymer-A(1) in Table I.

EXAMPLES 2-10

The polymerization process steps for Examples 2-10 were the same as that of Example 1. The ingredients and polymerization conditions for all ten Examples are found in Table I. The characterization of the resulting polymers is shown in Table II.

TABLE I

| Polymer | Monomer ml MAA | Monomer ml TBM | Solvent, ml chlorobenzene | AIBN mg | Poly Temp °C. | Poly Time hours | Yield gm |
|---|---|---|---|---|---|---|---|
| Copolymer-A(1) | 15 | 15 | 180 | 40 | 55 | 4 | 19.1 |
| Copolymer-A(2) | 15 | 15 | 180 | 40 | 55 | 3 | 11.2 |
| Copolymer-B(1) | 8.3 | 12.4 | 124 | 27.6 | 55 | 4 | 4.5 |
| Copolymer-B(2) | 12 | 18 | 180 | 40 | 55 | 4 | 14.5 |
| Copolymer-C(1) | 10 | 20 | 180 | 40 | 55 | 16 | 22.5 |
| Copolymer-C(2) | 10 | 20 | 180 | 40 | 55 | 5 | 20.5 |
| Copolymer-D | 8 | 22 | 180 | 40 | 55 | 5.5 | 14.1 |

TABLE I-continued

| Polymer | Monomer ml MAA | Monomer ml TBM | Solvent, ml chlorobenzene | AIBN mg | Poly Temp °C. | Poly Time hours | Yield gm |
|---|---|---|---|---|---|---|---|
| Copolymer-E | 5 | 25 | 180 | 40 | 55 | 6.5 | 12.5 |
| Copolymer-F | 3 | 27 | 180 | 40 | 55 | 7.0 | 6.7 |
| Copolymer-H | 7 | 23 | 180 | 40 | 45 | 17.0 | 10.0 |

Both the monomer ratio and polymerization time were varied in the synthesis. Monomer ratio in the polymerization mixture was varied to control the copolymer composition. Polymerization time was varied to control the monomer conversion. High conversion is undesirable since it often produces nonuniformity in copolymer composition. The polymerization conditions for the Copolymer-A(2) were different from the Copolymer-A(1) only in the polymerization time. Similarly, the polymerization time for the Copolymer-C(2) was shorter than that for the Copolymer-C(1). It can readily be seen from Tables I and II that as the polymerization time is shortened, the MAA content in the copolymer is increased. This is readily observed by comparing the composition and polymerization time of Copolymer-A(1) with Copolymer-A(2) and Copolymer-C(1) with Copolymer-C(2) and so on. Except for Copolymer-B(1) and Copolymer-F, the molecular weight distribution of all other resists are significantly less than 2.0. The best results were obtained with Copolymer-B(2), Copolymer-D and Copolymer-F which had compositions close to 2:1, 1:1 and 1:2 MAA/TBM, respectively.

It has been found, however, that copolymers having percentage compositions which include a predominance of the MAA units over the TBM units produce generally better results. More specifically copolymers comprising from about 55 to 80 mole percent methacrylic acid (MAA) and from 20 to 45 mole percent t-butyl methacrylate (TBM) and having a weight average molecular weight at or above 250,000 rate are preferred.

The characteristics of the polymers of Examples 1–10 are shown in Table II. The composition of the copolymers was determined by carbon and hydrogen analysis performed by Galbraith Laboratory of Knoxville, Tenn. The molecular weight and molecular weight distribution were determined by gel permeation chromatography (GPC) using tetrahydofuran (THF) as the solvent and monodisperse polystyrene as the standards. The molecular weight ($\bar{M}_w$) of the copolymers are all significantly higher than 300,000. The molecular weight distribution ($\bar{M}_w/\bar{M}_n$) is significantly less than 2.0 for both Copolymer-B(2) and Copolymer-D, and is slightly higher than 2.0 for Copolymer-F.

TABLE II

| Polymer | Composition Mole % MAA | Composition Mole % TBM | GPC $\bar{M}_w$ | GPC $\bar{M}_n$ | GPC $\bar{M}_w/\bar{M}_n$ |
|---|---|---|---|---|---|
| Copolymer-A(1) | 78.2 | 21.8 | 632,000 | 338,000 | 1.87 |
| Copolymer-A(2) | 80.3 | 19.7 | 507,000 | 359,000 | 1.41 |
| Copolymer-B(1) | 71.4 | 28.6 | 507,000 | 214,000 | 2.37 |
| Copolymer-B(2) | 68.9 | 31.1 | 579,000 | 405,000 | 1.43 |
| Copolymer-C(1) | 56.3 | 43.7 | 628,000 | 387,000 | 1.62 |
| Copolymer-C(2) | 64.7 | 35.3 | 640,000 | 469,000 | 1.36 |
| Copolymer-D | 55.7 | 44.3 | 609,000 | 378,000 | 1.61 |
| Copolymer-E | 41.9 | 58.1 | 509,000 | 303,000 | 1.68 |
| Copolymer-F | 36.4 | 63.6 | 385,000 | 182,000 | 2.11 |
| Copolymer-H | 57.1 | 42.9 | 457,000 | 235,000 | 1.95 |

RESIST PREPARATION

Solutions of the polymers of Examples 1–10 in methyl cellosolve (MCV) were prepared and spin coated on SiO$_2$ substrates. The parameters for Examples 1–4 and 6–9 are listed in Table III. The resist film thickness vs. spin speed in shown at the spin speeds of 0.6K, 1K, 2K and 3K rpm.

TABLE III

| Polymer | Coating Solution | Film Thickness um* 0.6K | 1K | 2K | 3K |
|---|---|---|---|---|---|
| Copolymer-A(1) | 6 gm/ml % MCV | | 1.10 | 0.76 | 0.61 |
| Copolymer-A(2) | 7 gm/ml % MCV | | 1.67 | 1.14 | 0.91 |
| Copolymer-B(1) | 7 gm/ml % MCV | 1.62 | 1.22 | 0.83 | |
| Copolymer-B(2) | 7 gm/ml % MCV | | 2.33 | 1.66 | 1.26 |
| Copolymer-C(2) | 7 gm/ml % MCV | | 2.11 | 1.45 | 1.16 |
| Copolymer-D | 7 gm/ml % MCV | 1.87 | 1.42 | 0.98 | |
| Copolymer-E | 7 gm/ml % MCV | | 1.37 | 0.92 | 0.78 |
| Copolymer-F | 7 gm/ml % MCV | | 1.66 | 1.14 | 0.90 |

*Film prebaked at 150° C. for 30 minutes in vacuum

In accordance with the invention, prior to exposure of the resist coated substrate to the electron beam, the coated substrate is prebaked at an elevated temperature normally above its glass transition temperature, but below its decomposition temperature for a predetermined time. It has been found that solubility and development behavior of the MAA/TBM copolymer resists are significantly dependent on the prebake temperature. In most cases, when the copolymers were prebaked at lower temperatures, 150°–160° C., the resist films tended to swell or crack in many solvents. Prebaking at 200° C., however, appears to have the effect of minimizing the swelling and the cracking and improve adhesion. Prebaking at 250° C., although likely to produce anhydride bonds in the resist, has also produced many tiny holes in the films. The optimum prebake temperature appears to be in the range of from about 200° C. to somewhat under 250° C. The normal prebake time was approximately 30 minutes.

After the prebaking step, to determine the sensitivity and the resolution of the resists, the resists were exposed to an electron beam in a Honeywell micropattern generator with two test patterns that cover a wide range of exposure. The sensitivity test pattern contained 50 lines 1 μm wide×1.5 mm long. The spacing between each line was 6 μm and the exposure ranged from $0.5 \times 10^{-6}$ to $450 \times 10^{-6}$ Coulombs cm$^{-2}$. The resolution test pattern contained 20 sets of 100 μm long lines. Each set contained six lines of equal exposure and the spacing between lines was 1 μm. The line charge density varied from $1 \times 10^{-12}$ to $1 \times 10^{-9}$ Coulombs cm$^{-1}$.

The resists were then developed utilizing wet solvent development techniques. It was discovered that the development technique used must be tailored to the specific copolymer composition-prebake temperature combination as both the polymer composition, i.e., the ratio of the monomers in the polymerized structure, and the prebake temperature significantly affect the final sensitivity of the electron resist.

As stated above, after exposure to the electron beam, the resists were developed utilizing a wet solvent spray development technique. Various developing solvents and combinations of developing solvents were utilized to develop the exposed resists. These include methyl cellosolve (MCV), isopropanol (IPA), cellosolve acetate (CA), methyl ethyl ketone (MEK), ethanol (EtOH) and methyl isobutyl ketone (MIBK), which were used alone or in combination. To be considered successful, developing must be accomplished with a minimum loss of thickness in the unexposed resist areas. A loss of 20% or less is considered acceptable in most cases. In all cases the prebaking step was observed to decrease polymer loss during the developing step.

While the full extent of the compositions of MAA/TBM which can successfully be used to achieve submicron resolution with excellent sensitivity is not fully known, as previously stated, the most successful copolymers of those in Table I appear to be Copolymer-B(2), Copolymer-D and Copolymer-F. These represent greatly differing percentage compositions.

In accordance with the present invention for the MAA/MCA Copolymer-B(2), prebaked 200° C., the preferred developing solvent has been found to be a combination of MCV and MIBK mixed 1:1. The normal spray time was approximately 40 seconds to 60 seconds and this was followed by rinsing in isopropanol for approximately 20 seconds. This also was observed to provide the best developing solvent for Copolymers F and D, however, good results were also obtained using a 1:1 mixture of MCV and IPA.

The Copolymer-B(2) exhibited the best sensitivity and resolution among the three. The sensitivity of the Copolymer-B(2) is $15 \times 10^{-6}$ Coulombs cm$^{-2}$ which is a factor of 8 more sensitive than PMMA, the recognized standard resist. The resist images showed minimum swelling and the submicron lines also possessed vertical walls. Developed resist images of Copolymer-B(2) are shown in the single FIGURE in the form of Scanning Electron Micrographs (SEM). The exposure dose was $17 \times 10^{-6}$ Coulomb cm$^{-2}$ for the pattern (a) and $1.7 \times 10^{-9}$ Coulombs cm$^{-1}$ the pattern (b). The patterns were spray developed using a MCV/MIBK (1:1) mixture for 40 seconds. Many exposures were performed on the Copolymer-F. Again, it was found that the resist films or Copolymer-F prebaked at 160° C. or 180° C. tend to crack or swell in many developer solvents. Prebaking at 200° C. appeared to have the effect of minimizing the swelling and cracking. While a developer of a 1:1 MCV/IPA mixture caused cracking in the resist film prebaked at 160° C., the same developer produced high resolution images in the film prebaked at 200° C.

Optimum development conditions for the MAA/TBM Copolymer-D have not yet been finally determined. For Copolymer-D, most developers tested induced swelling in the resist to a varying degree. However, the mixture of MCV/MIBK (1:1) developed the resist image in the Copolymer-D cleanly with the least degree of swelling. Good patterns were obtained using an exposure dose for the patterns of $20 \times 10^{-6}$ Coulomb cm$^{-2}$ and developing using MCV/MIBK (1:1) 40 seconds spray followed by 20 seconds IPA rinse. The resist film was prebaked at 200° C. before exposure.

The plasma etch rate which is indicative of how the resists stand up to micro circuit fabrication etching, also showed good results. The plasma etch rates of Copolymer-A(2), Copolymer-B(2), Copolymer-D and Copolymer-F were determined in a Plasma Therm planar etcher using $CF_4 + 4\% O_2$ as etch gases. For comparison, the etch rate of the standard PMMA (Ev2041) was also determined. The plasma etching conditions were: 200 watts (power), 50 ml/min. (gas flow rate), 300 miltorr (gas pressure), and the lower electrode temperature was maintained at 50° C. The plasma etch rate of certain of the resists compared to PMMA is shown in Table IV. The reactive ion etch rate of Copolymer-B(2) in relation to PMMA was also determined for two prebake temperatures using the same etching conditions as shown in Table V. It is seen from Tables IV and V that the plasma etch rates of the polymers are not significantly dependent on the prebake temperature. The plasma etch rate of MAA/TBM copolymers is generally about 85% of the etch rate of PMMA. The reactive ion etch rate of MAA/TBM Copolymer-B(2) is significantly lower than that of PMMA, about 70% of the etch rate of PMMA. Interestingly, the resist film etch rate of the Copolymer-F is seen to be significantly affected by the prebake temperature in contrast to the observation obtained for both Copolymer-B(2) and Copolymer-D. It can readily be observed that in all cases the plasma etching or ion etching rate was less than the standard PMMA resist which indicates less etching loss in processing.

TABLE IV

| Copolymer | Prebake Temperature °C. | Etch Rate Å/min | Etch Rate/PMMA Etch Rate |
|---|---|---|---|
| Copolymer-A(2) | 160 | 212 | 0.86 |
| Copolymer-B(2) | 160 | 216 | 0.88 |
| Copolymer-B(2) | 200 | 222 | 0.85 |
| Copolymer-D | 160 | 244 | 0.84 |
| Copolymer-D | 200 | 236 | 0.80 |
| Copolymer-F | 160 | 312 | 0.94 |
| Copolymer-F | 160 | 292 | 0.92 |
| Copolymer-F | 200 | 219 | 0.70 |
| Copolymer-F | 200 | 229 | 0.68 |

TABLE V

| Polymer | Prebake Temp °C. | Etch Rate Å/min | Etch Rate/PMMA Etch Rate |
|---|---|---|---|
| Copolymer-B(2) | 160 | 226 | 0.75 |
| Copolymer-B(2) | 200 | 200 | 0.67 |

The embodiments of the invention in which an exclusive property or right is claimed are defined as follows:

1. A method of producing a sensitive positive radiation sensitive resist image comprising the steps of:
   obtaining a solution of a radiation sensitive copolymer material comprising from about 55 to 80 mole percent methacrylic acid (MAA) and from about 20 to 45 mole percent t-butyl methacrylate (TBM), wherein the weight average molecular weight of the copolymer is equal to or greater than 250,000,
   coating a substrate with the solution of MAA/TBM copolymer to form a thin polymeric film of said polymeric material thereon;
   prebaking the coated substrate at a temperature equal to or greater than 200° but below the decomposition temperature of said polymer material;
   exposing said polymeric film to ionizing radiation in a predetermined pattern;
   developing said polymeric film.

2. The method according to claim 1, wherein said prebaking step is carried out at said prebaking temperature from about 20 minutes to about 2 hours.

3. The method according to any of claims 1 wherein said developing step further comprises spraying said exposed polymeric film on said substrate with a liquid solvent for said resist for a period of from about 10 seconds to 60 seconds.

4. The method according to claim 3 wherein said solvent is one selected from the group consisting of methyl cellosolve, methyl isobutyl ketone, isopropanol, cellosolve acetate, methyl ethyl ketone and ethanol or combinations thereof.

5. The method according to claim 4 wherein said developing step further comprises spraying said exposed polymeric film on said substrate with a liquid solvent comprising a mixture of methyl cellosolve and methyl isobutyl ketone have a ratio of approximately 1:1.

* * * * *